United States Patent
Park et al.

(10) Patent No.: US 11,258,015 B2
(45) Date of Patent: Feb. 22, 2022

(54) MASK CASSETTE ALIGNMENT DEVICE AND METHOD OF ALIGNING MASK CASSETTE

(71) Applicant: Samsung Display Co., Ltd., Yongin-si (KR)

(72) Inventors: Kwangbok Park, Cheonan-si (KR); Eojin Shin, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/679,008

(22) Filed: Nov. 8, 2019

(65) Prior Publication Data
US 2020/0152878 A1 May 14, 2020

(30) Foreign Application Priority Data
Nov. 13, 2018 (KR) .................. 10-2018-0138905

(51) Int. Cl.
*H01L 21/673* (2006.01)
*H01L 21/68* (2006.01)
*H01L 51/00* (2006.01)
*H01L 51/56* (2006.01)

(52) U.S. Cl.
CPC ........ *H01L 51/0012* (2013.01); *H01L 21/673* (2013.01); *H01L 21/682* (2013.01); *H01L 51/001* (2013.01); *H01L 51/0011* (2013.01); *H01L 51/56* (2013.01)

(58) Field of Classification Search
CPC ..... H01L 21/673; H01L 21/68; H01L 21/682; H01L 21/683; H01L 21/68785
See application file for complete search history.

(56) References Cited

U.S. PATENT DOCUMENTS 4,376,581 A * 3/1983 Mayer .................. G03F 9/70
355/41
2013/0291667 A1* 11/2013 Wu ...................... F16H 19/02
74/89.14

FOREIGN PATENT DOCUMENTS

| JP | 10-163094 A | 6/1998 |
| JP | 2011-181796 A | 9/2011 |
| KR | 10-1666803 B1 | 10/2016 |
| KR | 10-2018-0064120 A | 6/2018 |
| KR | 10-1894287 B1 | 9/2018 |

* cited by examiner

*Primary Examiner* — Tyrone V Hall, Jr.
(74) *Attorney, Agent, or Firm* — Lewis Roca Rothgerber Christie LLP

(57) ABSTRACT

A mask cassette alignment device includes: a first plate having a circular shape; and a first guide unit engaged with a side surface of the first plate and configured to rotate the first plate.

12 Claims, 8 Drawing Sheets

MASK CASSETTE ALIGNMENT DEVICE AND METHOD OF ALIGNING MASK CASSETTE

CROSS-REFERENCE TO RELATED APPLICATION

This application claims priority to and the benefit of Korean Patent Application No. 10-2018-0138905, filed on Nov. 13, 2018, in the Korean Intellectual Property Office (KIPO), the disclosure of which is incorporated by reference herein in its entirety.

BACKGROUND

1. Field

Aspects of some example embodiments of the present invention relate to a mask cassette alignment device and to a method of aligning a mask cassette.

2. Discussion of Related Art

An organic light emitting diode ("OLED") display device, which is a type of display device, realizes an image by self-emission by an organic material. A large-sized OLED display device may be manufactured by utilizing a mask method, and a deposition method in which a substrate and a patterned mask are horizontally arranged in a chamber to carry out deposition may be utilized. In such a case, before or after the mask is provided in the chamber to manufacture the OLED, the mask may be loaded in a mask cassette. In such a case, the mask cassette may be aligned by using a mask cassette alignment device so that the mask may be loaded in a correct position in the mask cassette.

The above information disclosed in this Background section is only for enhancement of understanding of the background of the invention and therefore the information in the present Background does not necessarily constitute prior art.

SUMMARY

Aspects of some example embodiments of the present invention relate to a mask cassette alignment device and to a method of aligning a mask cassette, and for example, to a mask cassette alignment device capable of aligning a mask cassette more precisely and to a method of aligning a mask cassette.

Aspects of some example embodiments of the present invention may be directed to a mask cassette alignment device capable of precisely placing a mask at a correct position in a mask cassette.

According to some example embodiments, a mask cassette alignment device includes: a first plate having a circular shape; and a first guide unit engaged with a side surface of the first plate and rotating the first plate.

According to some example embodiments, the first guide unit may include a first alignment bar, a worm unit, and a first driving unit. The first plate may include a worm gear unit disposed at the side surface of the first plate. The worm gear unit may be engaged with the worm unit and rotate the first plate.

According to some example embodiments, a rotation axis of the first plate may be perpendicular to a center axis of the first alignment bar and the worm unit.

According to some example embodiments, the mask cassette alignment device may further include a second guide unit and a third guide unit that are spaced apart from a rotation axis of the first plate on a plane.

According to some example embodiments, the first driving unit may be a linear motor.

According to some example embodiments, the mask cassette alignment device may further include: a second plate disposed on the first plate; a second guide unit disposed on the first plate and capable of moving the second plate along a first direction; and a third guide unit disposed on the first plate and capable of moving the second plate along a second direction that is perpendicular to the first direction.

According to some example embodiments, the second guide unit may include: a second alignment bar extending along the first direction; a second driving unit capable of moving the second plate in the first direction; and a first support unit supporting the second plate.

According to some example embodiments, the second driving unit may be a rotation motor. The second alignment bar may be connected to the first support unit by a ball screw. The first support unit may perform a rectilinear motion by a rotational motion of the second alignment bar.

According to some example embodiments, the second driving unit may be a linear motor or an air cylinder. The second alignment bar may be connected to the first support unit in a form of a rail.

According to some example embodiments, the third guide unit may include: a third alignment bar extending along the second direction; a third driving unit capable of moving the second plate in the second direction; and a second support unit supporting the second plate.

According to some example embodiments, the third driving unit may be a rotation motor. The third alignment bar may be connected to the second support unit by a ball screw.

According to some example embodiments, the third driving unit may be a linear motor or an air cylinder. The third alignment bar may be connected to the second support unit in a form of a rail.

According to some example embodiments, the mask cassette alignment device may further include a plurality of position sensors for measuring a position of a mask cassette disposed on the second plate.

According to some example embodiments, in a method of aligning a mask cassette, the method includes: a plurality of position sensors measuring a position of a mask cassette; calculating an angle by which the mask cassette is rotated with respect to a mask; a first guide unit rotating a first plate to correct the angle by which the mask cassette is rotated; a plurality of position sensors measuring a position of the mask cassette in a first direction and a second direction that is perpendicular to the first direction; and a second guide unit and a third guide unit moving a second plate in the first direction and the second direction to correct the position of the mask cassette in the first direction and the second direction.

According to some example embodiments, the first plate may have a circular shape.

According to some example embodiments, the first plate may include a worm gear unit disposed at a side surface of the first plate.

According to some example embodiments, the first guide unit may include a worm unit.

According to some example embodiments, calculating the angle by which the mask cassette is rotated with respect to the mask may include: defining a right triangle using the position of the mask cassette measured by the plurality of position sensors and a rotation axis of the first plate; and calculating an angle by which the first plate is rotated by applying an arctangent function to the right triangle.

According to some example embodiments, when the first guide unit rotates the first plate to correct the angle by which the mask cassette is rotated, the first plate may be rotatable by about 0 degrees or more and about 360 degrees or less.

According to some example embodiments, the first guide unit rotating the first plate to correct the angle by which the mask cassette is rotated may include disposing the mask cassette parallel to the mask.

The foregoing is illustrative only and is not intended to be in any way limiting. In addition to the illustrative aspects, embodiments, and features described above, further aspects, embodiments, and features will become more apparent by reference to the drawings and the following detailed description.

BRIEF DESCRIPTION OF THE DRAWINGS

A more complete appreciation of the present invention will become more apparent by describing in more detail aspects of example embodiments thereof with reference to the accompanying drawings, wherein.

DETAILED DESCRIPTION

Figure 1:
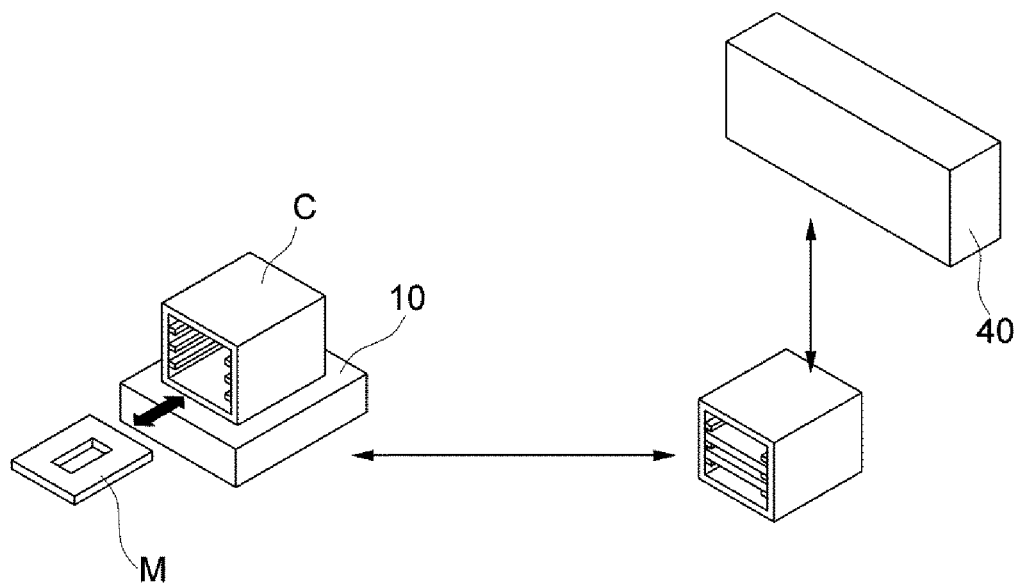
FIG. 1 is a view illustrating a channel of using a mask and a mask cassette according to some example embodiments.

Aspects of some example embodiments will now be described more fully hereinafter with reference to the accompanying drawings. Although the invention may be modified in various manners and have several embodiments, embodiments are illustrated in the accompanying drawings and will be mainly described in the specification. However, the scope of the present invention is not limited to the example embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to more specifically describe embodiments of the present invention and like reference numerals refer to like elements throughout the specification.

FIG. 1 is a view illustrating a channel of using a mask and a mask cassette.

Hereinafter, a channel of using a mask and a mask cassette will be described with reference to FIG. 1.

A mask cassette transports a mask between a deposition equipment 40 and a mask storing place. For example, in order to use the mask, stored in the mask storing place, in a deposition process, the mask may be loaded on the mask cassette in the mask storing place by using a fork unit and transported to the deposition equipment 40. For example, when the mask is loaded on the mask cassette, embodiments may enable precisely aligning the mask cassette in terms of its position with respect to the mask for the process yield and the process speed. According to some example embodiments, the mask cassette may be precisely aligned when the mask is loaded on the mask cassette, thus capable of improving the process yield and substantially preventing the process from being delayed. For example, in a related-art process, a mask may be loaded on a mask cassette by aligning a position of the mask and then aligning a position of the mask cassette. However, according to example embodiments of the present disclosure, when the mask is transported by a fork unit to be loaded on the mask cassette, the mask cassette may be aligned with respect to the mask that is transported to the fork unit, such that the mask may be precisely aligned and loaded on the mask cassette without the mask alignment process.

Figure 2:
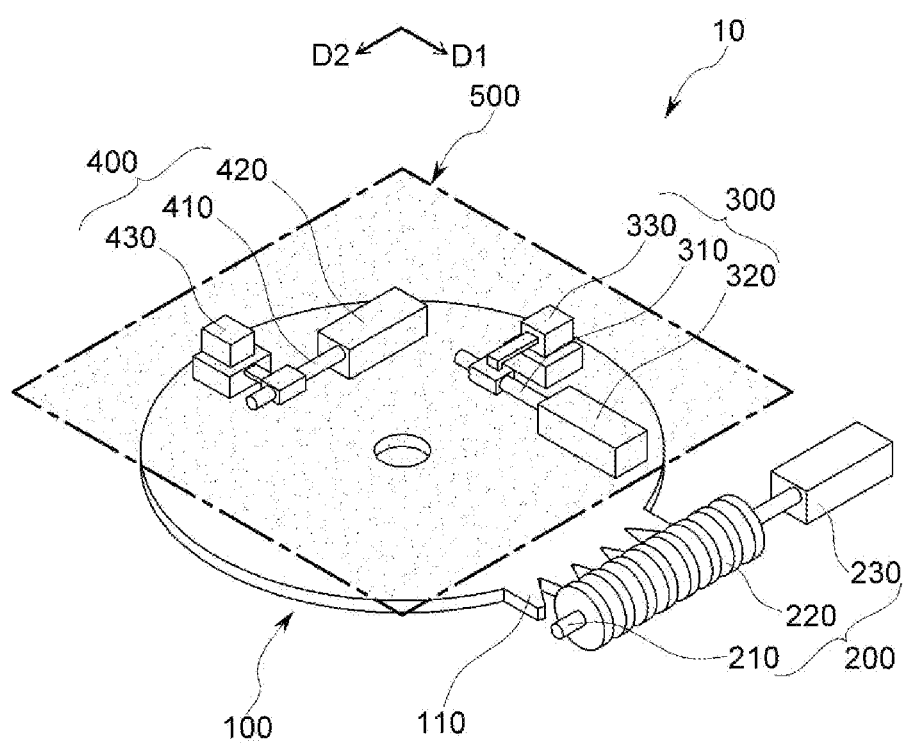
FIG. 2 is a mask cassette alignment device according to some example embodiments.
Figure 3:
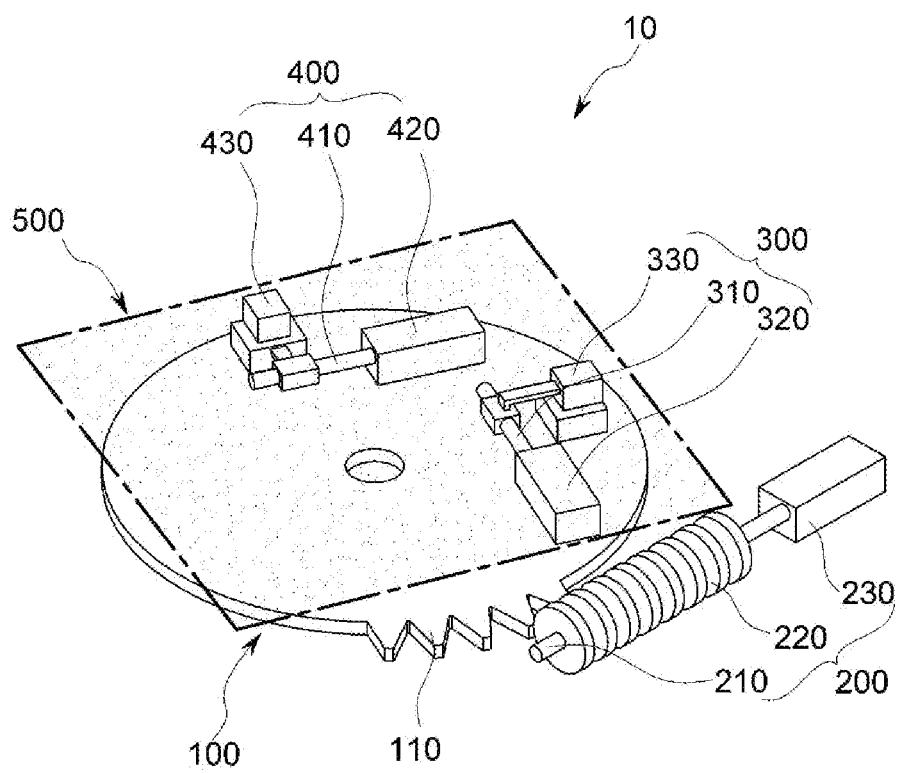
FIG. 3 is a mask cassette alignment device aligned according to some example embodiments.

FIG. 2 is a mask cassette alignment device according to some example embodiments, and FIG. 3 is a mask cassette alignment device aligned according to some example embodiments.

Hereinafter, a mask cassette alignment device 10 according to some example embodiments will be described in more detail with reference to FIGS. 2 and 3.

The mask cassette alignment device 10 according to some example embodiments includes a first plate 100, a first guide unit 200, a second guide unit 300, a third guide unit 400, and a second plate 500. In addition, the mask cassette alignment device 10 according to some example embodiments may further include a plurality of position sensors (S1 and S2 in FIG. 6).

The first plate 100 has a circular shape and supports the second guide unit 300, the third guide unit 400, and the second plate 500.

The first plate 100 includes a worm gear unit 110 located on a side surface of the first plate 100. For example, the worm gear unit 110 includes a worm gear that protrudes in a direction of a normal line of the side surface of the first plate 100. The worm gear may be engaged with a worm unit 220, to be described below, and receive a power of the first guide unit 200 to rotate the first plate 100. According to some example embodiments, as illustrated in FIG. 2, the worm gear unit 110 may be located on at least a part of side surfaces of the first plate 100. However, embodiments are not limited thereto, and the first plate 100 may be located on all side surfaces of the first plate 100, and thus the first plate 100 may rotate by an angle of about 0 degrees or more and about 360 degrees or less.

As illustrated in FIGS. 2 and 3, because the first plate 100 has a circular shape, it may rotate about a rotation axis. Accordingly, the mask cassette alignment device 10 according to some example embodiments may precisely control the rotation of the first plate 100, and thus the mask cassette alignment device according to some example embodiments has a higher degree of rotation precision.

The rotation axis of the first plate 100 may be perpendicular to a center axis of the first alignment bar 210 and the worm unit 220 of the first guide unit 200 to be described below.

The first guide unit 200 is located adjacent to the first plate 100, and engaged with the worm gear unit 110 of the first plate 100 to rotate the first plate 100.

The first guide unit 200 includes the first alignment bar 210, the worm unit 220 and a first driving unit 230.

The first alignment bar 210 extends in a tangential direction of the first plate 100. One side of the first alignment bar 210 is connected to the worm unit 220, and another side of the first alignment bar 210 is connected to the first driving unit 230.

The first alignment bar 210 may perform a rectilinear motion in the tangential direction of the first plate 100 by the first driving unit 230 which is connected to the first alignment bar 210. For example, the first alignment bar 210 may linearly move in a direction in which the first alignment bar 210 extends.

The worm unit 220 may include a plurality of worms that protrude from the first alignment bar 210. The plurality of worms protrude in a direction that is perpendicular to a direction in which the first alignment bar 210 extends, and at least a part of the plurality of worms may be engaged with the worm gear unit 110 that is disposed at the side surface of the first plate 100. For example, the plurality of worms protrude in a normal direction of the side surface of the first plate 100, and may be engaged with the worm gear of the first plate 100 that protrudes in a normal direction of the side surface of the first plate 100.

The first driving unit 230 may include a rotation motor, and may rotate the first alignment bar 210 connected to the first driving unit 230. When the first alignment bar 210 is rotated by the first driving unit 230, the worm unit 220 rotates together with the first alignment bar 210, and due to the rotation of the worm unit 220, the worm gear of the worm gear unit 110 engaged with the worm unit 220 rotates about the rotation axis AP of the first plate 100.

In addition, due to the rotation of the worm gear of the worm gear unit 110, the first plate 100 rotates about the rotation axis AP.

In addition, according to some example embodiments, the first driving unit 230 may linearly move the first alignment bar 210 that is connected to the first driving unit 230. For example, the first driving unit 230 may allow the first alignment bar 210 to move linearly in the tangential direction of the first plate 100. For example, the first driving unit 230 may be a linear motor that may impart a rectilinear motion or an air cylinder that operates with pneumatic pressure. However, embodiments are not limited thereto, and the first driving unit 230 may be any element capable of moving the first alignment bar 210 linearly.

Because the first driving unit 230 moves the first alignment bar 210 in the tangential direction of the first plate 100, the worm unit 220 moves along the tangential direction of the first plate 100, and the worm gear unit 110 that is engaged with the worm unit 220 moves along the tangential direction of the first plate 100. Accordingly, the first plate 100 moves in the tangential direction of the first plate 100 while rotating. That is, the rectilinear motion of the first guide unit 200 is transmitted according to the engagement between the worm gear unit of the first plate 100 and the worm unit of the first guide unit 200, and is converted into a rotational motion of the first plate 100.

According to some example embodiments, because the worm gear unit 110 of the first plate 100 and the worm unit 220 of the first guide unit 200 are engaged with each other to rotate the first plate 100, an angle of the first plate 100 may be precisely adjusted and thus the mask cassette may be precisely aligned. Accordingly, the mask cassette alignment device according to some example embodiments may have improved rotation precision and improve the manufacturing yield.

The second guide unit 300 is located on the first plate 100 at a distance from a rotation axis (AP in FIG. 6) of the first plate 100. The second guide unit 300 may move the second plate 500 that is located on the second guide unit 300 along a first direction D1.

The second guide unit 300 includes a second alignment bar 310, a second driving unit 320, and a first support unit 330.

The second alignment bar 310 extends in the first direction D1. One side of the second alignment bar 310 may be connected to the first support unit 330 through a ball screw or in the form of a rail, and another side of the second alignment bar 310 may be directly connected to the second driving unit 320. In a case where the second alignment bar 310 is connected to the first support unit 330 through a ball screw, the first support unit 330 performs a rectilinear motion by the rotational motion of the second alignment bar 310. In a case where the second alignment bar 310 is connected to the first support unit 330 in the form of a rail, the first support unit 330 performs a rectilinear motion by the rectilinear motion of the second alignment bar 310. However, the connection structure of the second alignment bar 310 with the first support unit 330 and the second driving unit 320 is not limited thereto.

The second alignment bar 310 may perform a rectilinear motion along the first direction D1 by the second driving unit 320 that is connected to the second alignment bar 310. For example, the second alignment bar 310 may linearly move in a direction in which the second alignment bar 310 extends.

The second driving unit 320 may rotate the second alignment bar 310 that is connected to the second driving unit 320. For example, the second driving unit 320 may be a rotation motor, and in such an embodiment, the second alignment bar 310 may be connected to the first support unit 330 by a ball screw.

In addition, according to some example embodiments, the second driving unit 320 may linearly move the second alignment bar 310 that is connected to the second driving unit 320. For example, the second driving unit 320 may allow the second alignment bar 310 to move linearly in the first direction D1. The second driving unit 320 may be a linear motor or an air cylinder that operates with pneumatic pressure, and in such an embodiment, the second alignment bar 310 may be connected to the first support unit 330 in the form of a rail. However, embodiments are not limited thereto, and the second driving unit 320 and the second alignment bar 310 may be elements capable of moving the first support unit 330 linearly on a plane.

The first support unit 330 is connected to one side of the second alignment bar 310 and supports the second plate 500 to be described in more detail below.

The first support unit 330 may be connected to the second alignment bar 310 through a ball screw or in the form of a rail. However, embodiments are not limited thereto, and the first support unit 330 may be configured to be linearly movable on a plane. Accordingly, the first support unit 330 may move linearly by a power of the second driving unit 320.

The third guide unit 400 is arranged on the first plate 100 at a distance from the rotation axis (AP in FIG. 6) of the first plate 100, and may move the second plate 500 that is arranged on the third guide unit 400 in a second direction D2.

The third guide unit 400 includes a third alignment bar 410, a third driving unit 420, and a second support unit 430.

The third alignment bar 410 extends in the second direction D2. One side of the third alignment bar 410 may be connected to the second support unit 430 through a ball screw or in the form of a rail, and another side of the third alignment bar 410 may be directly connected to the third driving unit 420. However, the connection structure of the third alignment bar 410 with the second support unit 430 and the third driving unit 420 is not limited thereto.

The third alignment bar 410 may perform a rectilinear motion along the second direction D2 that is perpendicular on a plane to the first direction D1 by the third driving unit 420 that is connected to the third alignment bar 410. For example, the third alignment bar 410 may linearly move in a direction in which the third alignment bar 410 extends.

The third driving unit 420 may rotate the third alignment bar 410 that is connected to the third driving unit 420. For example, the third driving unit 420 may be a rotation motor, and in such an embodiment, the third alignment bar 410 may be connected to the second support unit 430 by a ball screw.

According to some example embodiments, the third driving unit 420 may linearly move the third alignment bar 410 that is connected to the third driving unit 420. For example, the third driving unit 420 may allow the third alignment bar 410 to move linearly in the second direction D2. The third driving unit 420 may be a linear motor or an air cylinder that operates with pneumatic pressure, and in such an embodiment, the third alignment bar 410 may be connected to the second support unit 430 in the form of a rail. However, embodiments are not limited thereto, and the third driving unit 420 and the third alignment bar 410 may be elements capable of moving the second support unit 430 linearly on a plane.

The second support unit 430 is connected to one side of the third alignment bar 410 and supports the second plate 500 to be described below.

The second support unit 430 may be connected to the third alignment bar 410 through a ball screw or in the form of a rail. However, embodiments are not limited thereto, and the second support unit 430 may be configured to be linearly movable on a plane. Accordingly, the second support unit 430 may move linearly by a power of the third driving unit 420.

The second plate 500 is arranged on the second guide unit 300 and the third guide unit 400 and overlaps the first plate 100 on a plane. For example, the second plate 500 is supported by the first support unit 330 of the second guide unit 300 and the second support unit 430 of the third guide unit 400.

A mask cassette may be arranged on the second plate 500.

Figure 6:
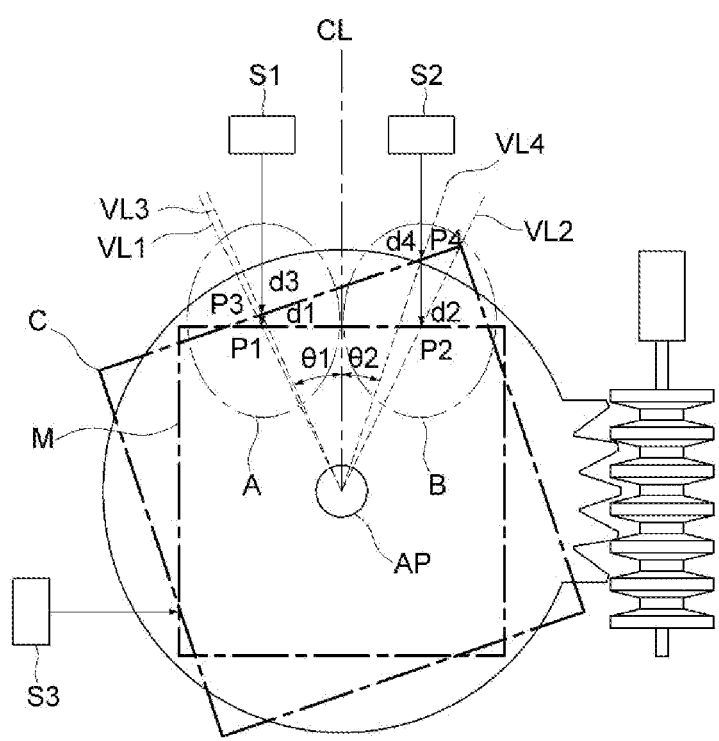

The mask cassette alignment device 10 according to some example embodiments may further include a plurality of position sensors (S1 and S2 in FIG. 6).

The plurality of position sensors S1 and S2 may measure a position of the mask cassette located on the second plate 500 and a position of a mask located in the mask cassette by a fork unit.

Each of the position sensors S1 and S2 may be secured at a specific position, which will be described in more detail with reference to FIG. 6.

Each of the position sensors S1 and S2 may be a displacement sensor. For example, each of the position sensors S1 and S2 may be a linear displacement sensor. However, embodiments are not limited thereto, and each of the position sensors S1 and S2 may be a sensor for measuring a position of the mask cassette located on the second plate 500 and a position of the mask located in the mask cassette by a fork unit.

Figure 4:
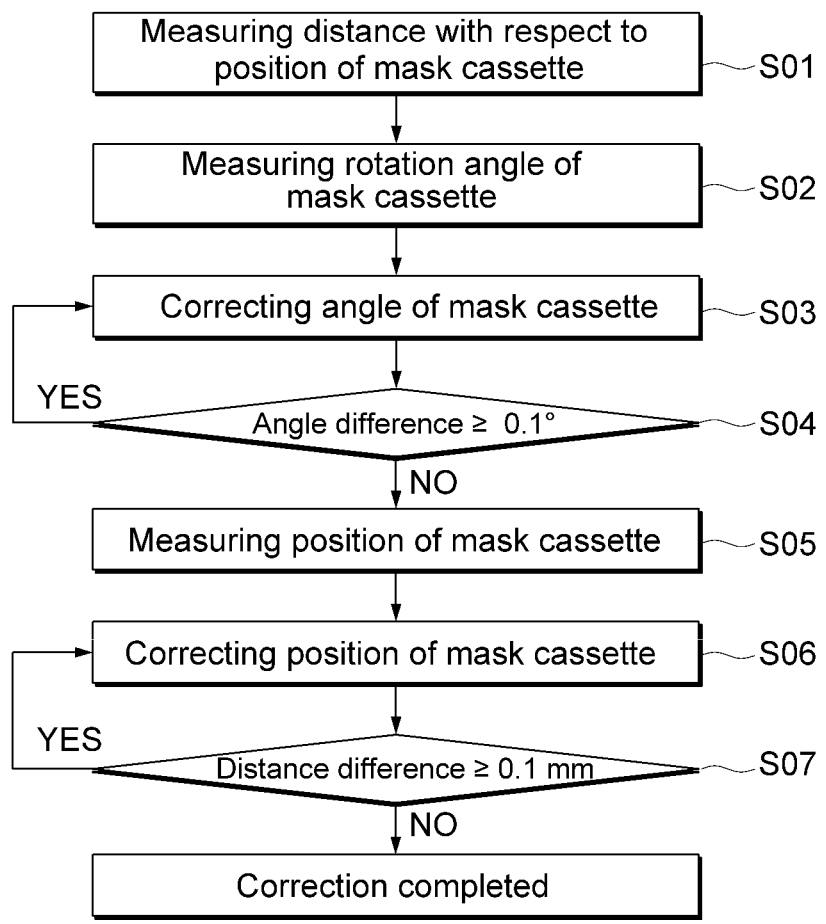
FIG. 4 is a mask cassette aligning algorithm according to some example embodiments.

FIG. 4 is a mask cassette aligning algorithm according to some example embodiments, and FIGS. 5 to 8 are views illustrating a process of alignment according to some example embodiments.

Hereinafter, a method of aligning a mask cassette by using the mask cassette alignment device 10 according to some example embodiments will be described in more detail with reference to FIGS. 4 to 8.

Figure 5:
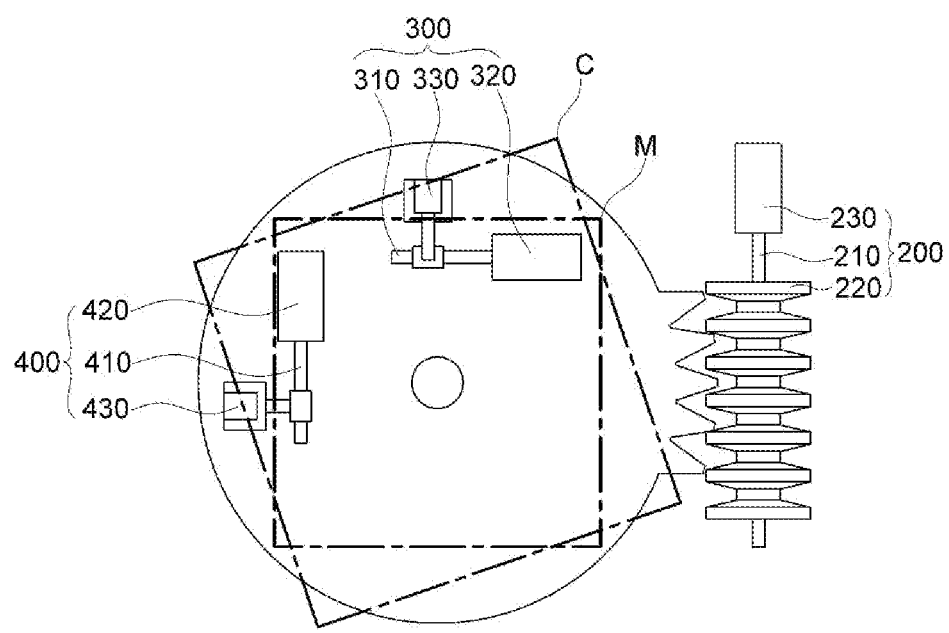
FIGS. 5 to 8 are views illustrating a process of alignment according to some example embodiments.

First, as illustrated in FIGS. 4 and 5, in order to locate a mask cassette C that is arranged on the mask cassette alignment device 10, a distance by which the mask cassette C is spaced apart from a position of a mask M is measured (S01). For example, as illustrated in FIG. 6, the two position sensors S1 and S2 are arranged facing one side surface of the mask cassette C, and each of the position sensors S1 and S2 may measure a position of the mask M and a position of the mask cassette C. For example, the two position sensors S1 and S2 are located at one side surface of the first plate 100, and each of the position sensors S1 and S2 measures a position an adjacent portion of each of the mask M and the mask cassette C. For example, the mask M is in a state of being aligned in a correct position, and each of the position sensors S1 and S2 is located so that respective angles between an virtual center line CL that is perpendicular to the mask M on a plane and passes through the rotation axis AP of the first plate 100 and each of a first virtual line VL1 and a second virtual line VL2 that pass through rotation axis AP and positions P1 and P2 of the mask M measured by the position sensors S1 and S2, respectively, have a substantially same value.

Based on the measured distances, an angle by which the mask cassette C is rotated more with respect to the mask M is calculated (S02). For example, in a case where the mask cassette C is aligned after aligning the mask M, as illustrated in FIG. 6, the positions P1 and P2 of the aligned mask M in respective areas A and B are fixed, and the two position sensors S1 and S2 measure positions P3 and P4 of the mask cassette C in the areas A and B, respectively. For example, distances d1 and d2 from the two position sensors S1 and S2 to the mask M and distances d3 and d4 from the two position sensors S1 and S2 to the mask cassette C may be measured.

A right triangle may be defined with the position P3 of the mask cassette C in the area A, the rotation axis AP of the first plate 100, and a virtual line, perpendicular to the mask M on a plane, which serves as a bottom side (L1) of the right triangle. In such an embodiment, based on the position P3 of the mask cassette C in the area A, a length of each side of the right triangle defined at the area A may be calculated. For example, a length L1 of the bottom side of the right triangle defined at the area A is the sum of ½ of a length of the mask M in the second direction D2 and a difference value between the distance d1 from the position sensor S1 to the position P1 of the mask M in the area A and the distance d3 from the position sensor S1 to the position P3 of the mask cassette C in the area A. In addition, a height H1 of the right triangle defined at the area A is a length from the virtual center line CL to the position P3 of the mask cassette C in the area A. The length L1 of the bottom side of the right triangle defined at the area A and the height H1 thereof are calculated as described above, and an arctangent function (Equation 1) is applied to the length L1 of the bottom side of the right triangle and the height H1 thereof, and accordingly, an angle θ1 between a third virtual line VL3 that connects the rotation axis AP of the first plate 100 and the position P3 of the mask cassette C in the area A and the virtual center line CL that is perpendicular to the mask M on a plane and passes through the rotation axis AP of the first plate 100 may be calculated.

$$\theta1 = \arctan(H1/L1) \qquad \text{Equation 1}$$

A right triangle may be defined with the position P4 of the mask cassette C in the area B, the rotation axis AP of the first plate 100, and a virtual line, perpendicular to the mask M on a plane, which serves as a bottom side (L2) of the right triangle. In such an embodiment, based on the position P4 of the mask cassette C in the area B, a length of each side of the right triangle defined at the area B may be calculated. In specific, a length L2 of the bottom side of the right triangle defined at the area B is the sum of ½ of a length of the mask M in the second direction D2 and a difference value between the distance d2 from the position sensor S2 to the position P2 of the mask M in the area B and the distance d4 from the position sensor S2 to the position P4 of the mask cassette C in the area B. In addition, a height H2 of the right triangle defined at the area B is a length from the virtual center line CL to the position P4 of the mask cassette C in the area B. The length L2 of the bottom side of the right triangle defined at the area B and the height H2 thereof are calculated as described above, and an arctangent function (Equation 2) is applied to the length L2 of the bottom side of the right triangle and the height H2 thereof, and accordingly, an angle θ2 between a fourth virtual line VL4 that connects the rotation axis AP of the first plate 100 and the position P4 of the mask cassette C in the area B and the virtual center line CL that is perpendicular to the mask M on a plane and passes through the rotation axis AP of the first plate 100 may be calculated.

$$\theta2 = \arctan(H2/L2) \qquad \text{Equation 2}$$

In such an embodiment, based on a difference between the angle θ1 defined by the third virtual line VL3 and the virtual center line CL and the angle θ2 defined by the fourth virtual line VL4 and the virtual center line CL, a rotation angle of the first plate 100 to be corrected may be calculated.

Figure 7:
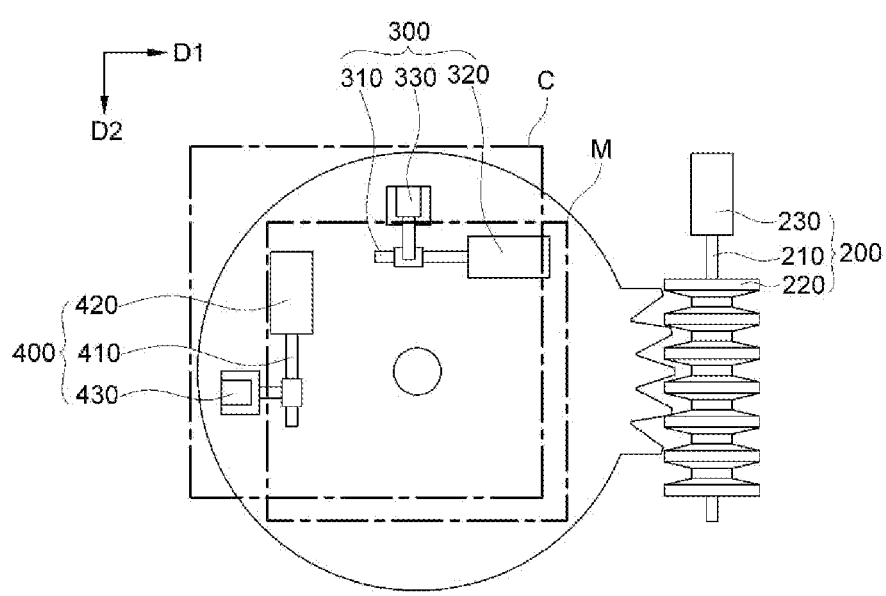
Figure 8:
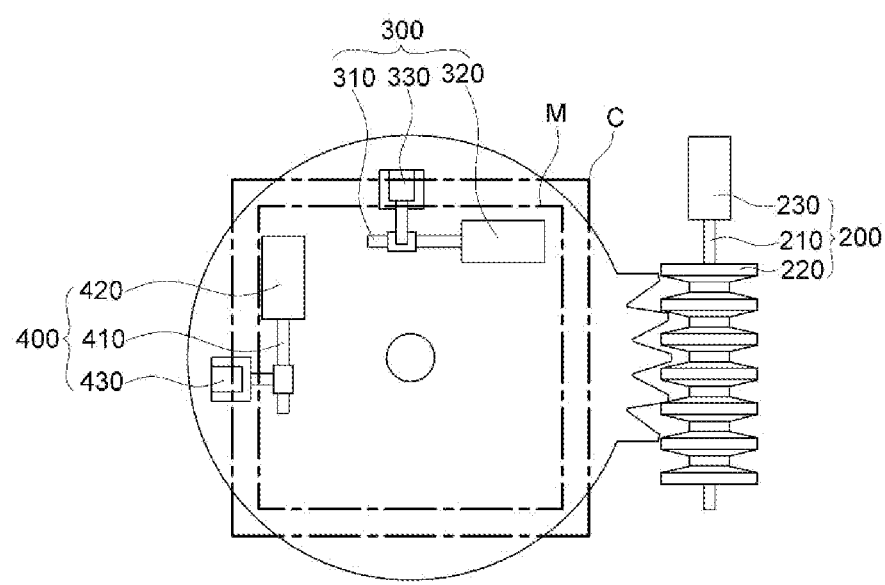

Next, as illustrated in FIGS. 4 and 7, the angle by which the mask cassette C is rotated is corrected (S03). In specific, the first guide unit 200 rotates the first plate 100 in a direction opposite to the direction in which the mask cassette C is rotated by a degree by which the mask cassette C is rotated with respect to the mask M, so that the mask cassette C has an angle substantially equal to an angle of the mask M, and thus the rotation angle may be corrected.

Next, it is determined whether an angle of the mask cassette C after correction with respect to a correct position of the mask M is greater than 0.1 degrees (S04). For example, in a case where there is a difference of more than 0.1 degrees in the angle of the mask cassette C after correction with respect to the correct position of the mask M, the process proceeds over again from calculating an angle by which the mask cassette C is rotated. On the other hand, in a case where there is a difference of about 0.1 degrees or less, a position of the mask cassette C in the first direction D1 and the second direction D2 is measured.

Next, a position of the mask cassette C with respect to the mask M is measured (S05). For example, two position sensors S1 and S2 may be located, one facing one side surface of the mask cassette C and the other one facing another side surface of the mask cassette C that is perpendicular to the one side surface. One of the two position sensors S1 and S2 that is located facing one side surface of the mask cassette C may measure positions of the mask M and the mask cassette C in the first direction D1, and the other of the two position sensors S1 and S2 that is disposed facing another side surface of the mask cassette C may measure positions of the mask M and the mask cassette C in the second direction D2.

Next, positional correction for the mask cassette C in the first direction D1 and the second direction D2 is performed (S06). In such an embodiment, the mask cassette alignment device 10 according to some example embodiments may rotate the first plate 100 in a range from about 0 degrees to about 360 degrees, and may have a wider range of rotation radius.

Next, it is determined whether a position of the mask cassette C after correction is spaced apart from a fixed position by a distance of more than 0.1 mm (S07). For example, in a case where the mask cassette C is spaced apart from the fixed position by a distance of more than 0.1 mm, the positional correction of the mask cassette C in the first direction D1 and the second direction D2 is performed again. On the other hand, in a case where the mask cassette C is spaced apart from the fixed position by a distance of about 0.1 mm or less, the alignment process ends.

As set forth hereinabove, the mask cassette alignment device according to one or more embodiments of the present invention may improve rotation precision, by including a vertical axis, a horizontal axis and a rotation axis with a worm gear.

While aspects of some example embodiments of the present invention have been illustrated and described with reference to the embodiments thereof, it will be apparent to those of ordinary skill in the art that various changes in form and detail may be made thereto without departing from the spirit and scope of the present invention, as defined by the following claims and their equivalents.

What is claimed is:

1. A mask cassette alignment device comprising:
a first plate having a circular shape;
a first guide unit engaged with a side surface of the first plate and configured to rotate the first plate;
a second plate on the first plate; and
a second guide unit on the first plate between the first plate and the second plate, wherein the second guide unit on the first plate is capable of moving the second plate along a first direction; and
a third guide unit on the first plate is capable of moving the second plate along a second direction that is perpendicular to the first direction.

2. The mask cassette alignment device of claim 1, wherein the first guide unit comprises a first alignment bar, a worm unit, and a first driving unit,
the first plate comprises a worm gear unit at the side surface of the first plate, and
the worm gear unit is engaged with the worm unit and rotates the first plate.

3. The mask cassette alignment device of claim 2, wherein a rotation axis of the first plate is perpendicular to a center axis of the first alignment bar and the worm unit.

4. The mask cassette alignment device of claim 2, further comprising the second guide unit and a third guide unit that are spaced apart from a rotation axis of the first plate on a plane.

5. The mask cassette alignment device of claim 2, wherein the first driving unit is a rotation motor.

6. The mask cassette alignment device of claim 1, wherein the second guide unit comprises:
a second alignment bar extending along the first direction;
a second driving unit capable of moving the second plate in the first direction; and
a first support unit supporting the second plate.

7. The mask cassette alignment device of claim 6, wherein the second driving unit is a rotation motor,
the second alignment bar is connected to the first support unit by a ball screw, and
the first support unit performs a rectilinear motion by a rotational motion of the second alignment bar.

8. The mask cassette alignment device of claim 6, wherein the second driving unit is a linear motor or an air cylinder, and
the second alignment bar is connected to the first support unit in a form of a rail.

9. The mask cassette alignment of claim 1, wherein the third guide unit comprises:
a third alignment bar extending along the second direction;
a third driving unit capable of moving the second plate in the second direction; and
a second support unit supporting the second plate.

10. The mask cassette alignment device of claim 9, wherein the third driving unit is a rotation motor, and
the third alignment bar is connected to the second support unit by a ball screw.

11. The mask cassette alignment device of claim 9, wherein the third driving unit is a linear motor or an air cylinder, and
the third alignment bar is connected to the second support unit in a form of a rail.

12. The mask cassette alignment device of claim 9, further comprising a plurality of position sensors configured to measure a position of a mask cassette on the second plate.

* * * * *